United States Patent
Sayeed

(10) Patent No.: US 7,499,508 B2
(45) Date of Patent: Mar. 3, 2009

(54) METHOD AND APPARATUS FOR ADJUSTING THE GAIN OF AN IF AMPLIFIER IN A COMMUNICATION SYSTEM

(75) Inventor: Zulfiquar Sayeed, East Windsor, NJ (US)

(73) Assignee: Agere Systems Inc., Allentown, PA (US)

( * ) Notice: Subject to any disclaimer, the term of this patent is extended or adjusted under 35 U.S.C. 154(b) by 1943 days.

(21) Appl. No.: 09/826,399

(22) Filed: Apr. 3, 2001

(65) Prior Publication Data

US 2002/0186799 A1      Dec. 12, 2002

(51) Int. Cl.
*H04L 27/08* (2006.01)
(52) U.S. Cl. .................. 375/345; 455/127.1; 455/232.1; 455/234.1; 455/245.1
(58) Field of Classification Search .................. 375/345, 375/227, 281, 316, 130, 350, 346, 264, 222; 455/232.1, 234.1, 249.1, 296, 303, 127.1, 455/245.1; 370/208, 210, 487; 330/129, 330/285
See application file for complete search history.

(56) References Cited

U.S. PATENT DOCUMENTS

| | | | |
|---|---|---|---|
| 5,194,822 A * | 3/1993 | Bureau et al. ............... | 330/129 |
| 5,416,798 A * | 5/1995 | Hirose et al. ................ | 375/227 |
| 5,790,514 A * | 8/1998 | Marchok et al. ............ | 370/208 |
| 6,044,253 A * | 3/2000 | Tsumura .................. | 455/234.1 |
| 6,388,526 B1 * | 5/2002 | Daniel et al. ................ | 330/285 |
| 6,522,626 B1 * | 2/2003 | Greenwood ................. | 370/208 |
| 6,532,358 B1 * | 3/2003 | Earls et al. ............... | 455/234.1 |
| 6,594,320 B1 * | 7/2003 | Sayeed ....................... | 375/281 |
| 6,614,855 B1 * | 9/2003 | Okamoto .................... | 375/316 |
| 6,735,422 B1 * | 5/2004 | Baldwin et al. .......... | 455/232.1 |

* cited by examiner

*Primary Examiner*—Ted Wang
(74) *Attorney, Agent, or Firm*—Ryan, Mason & Lewis, LLP

(57) ABSTRACT

An automatic gain control technique is disclosed for adjusting the gain of an IF amplifier in a communication system, such as an OFDM or DMT communication system. The gain of an RF amplifier is controlled by a known RF automatic gain control circuit that generates an RF gain value. The disclosed IF automatic gain control (AGC) circuit controls the gain of an IF amplifier in the receiver. The disclosed IF AGC monitors the RF gain value, as well as pre-FFT and post-FFT signal energy measurements performed before and after a fast Fourier transform (FFT) stage, respectively, to maintain a desired set point. The IF AGC adjusts the previous IF gain value by an amount opposite to the adjusted RF gain value, if any. If there is no RF gain adjustment, then the IF AGC will adjust the IF gain based on thresholds established for the pre-FFT and post-FFT measurements. If the pre-FFT measurement is within a desired tolerance of the pre-FFT threshold, then the IF gain will be lowered in stepped increments. Otherwise, the IF gain adjustment is the minimum of the difference between (i) the pre-FFT measurement and its threshold, or (ii) the post-FFT measurement and its threshold, multiplied by a loop gain constant.

17 Claims, 10 Drawing Sheets

CORRELATION OF 184 SAMPLES SPACED 2048 SAMPLES APART. THE PROCESS IS REPEATED TO GET 2232 SAMPLE CORRELATION OUTPUT AS SHOWN BELOW.

| 0 | 1 | 18 | 2030 | 2047 |
|---|---|---|---|---|
| ZERO CARRIER | POSITIVE CARRIERS | UNUSED CARRIERS FOR MODSC | | NEGATIVE CARRIERS |
FIG. 8
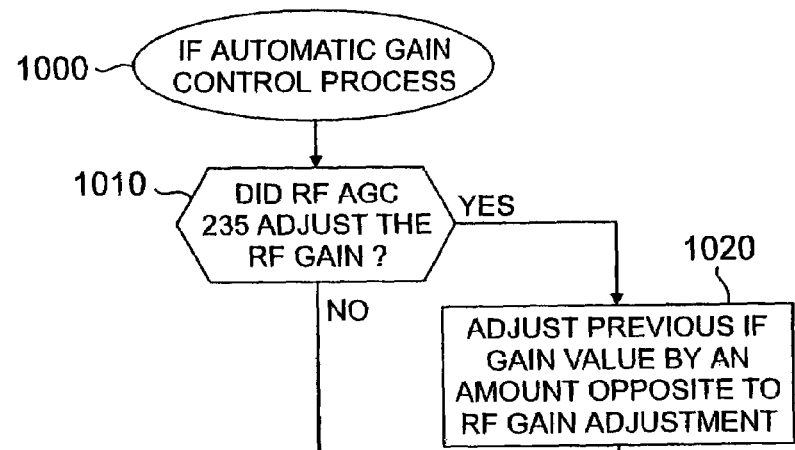
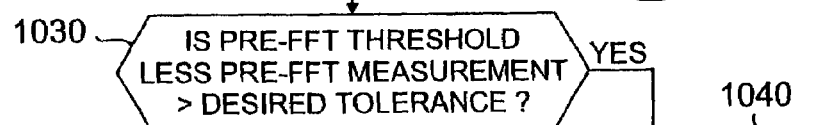
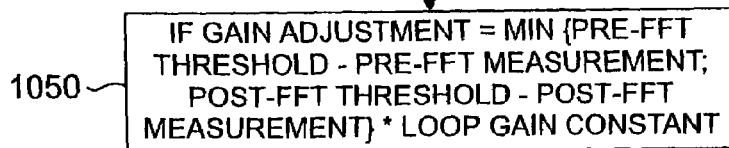
FIG. 10

```
INPUT_PORT(1) register float *Prepower;
INPUT_PORT(2) register float *Postpower;
INPUT_PORT(3) register float *RFgain;
OUTPUT_PORT(1) register float *Output;  /*IF AGC Gain in dB*/

BLOCKFACTOR long BlockFactor;

PARAMETER(1) float OutputIntervalWidth;/*71 dB*/
PARAMETER(2) float SetPointdBPre;      /*42.2*/
PARAMETER(3) float SetPointdBPost;     /*32.2*/
PARAMETER(4) float Kagc;               /*0.25*/
PARAMETER(5) float PreDropdB;          /*3.0*/
PARAMETER(6) long WaitTime;            /*8 OFDM Frames!!*/

STATE float oldoutput;
STATE float oldrfgain;
STATE long counter;

include <math.h> void init ofdmagccontrol2()
{
/*initialize Sum*/
oldoutput = 0.0;
counter = WaitTime;
} void ofdmagccontrol2()
{
register float dbinpre, dbinpost, err, rfgain, output;
float HalfInterval = (OutputIntervalWidth / 2.0);
```

FIG. 11A

```
LOOP(BlockFactor)

printf("--------------------IFbeg----------------\n");
        dbinpre = *Prepower++; dbinpost = *Postpower++;
        rfgain = *RFgain++;

printf("prepower = %f, post = %f, rfgain = %f\n", dbinpre, dbinpost, rfgain);
        if((rfgain - oldrfgain)! = 0.0)
                {
                output = oldoutput - (rfgain - oldrfgain);
                printf("ifgain = -rfdiff = %f, oldrfgain = %f\n", output, oldrfgain);
                }
        else if ((SetPointdBPre-PreDropdB - dbinpre <= 0.0) && (counter >= WaitTime))
                {
                output = oldoutput - (PreDropdB + 2.0);
                printf("ifgain = due to Pre = %f\n", - PreDropdB);
                counter = 0;
                }
        else
                {
                counter++;
                if(SetPointdBPre - dbinpre < SetPointdBPost - dbinpost)
                        err = SetPointdBPre - dbinpre;
                else
                        err = SetPointdBPost - dbinpost;
                err = Kagc*err;
                output = oldoutput + err;
                printf("output = %f\n", output);
                } if(output >= HalfInterval)
                output = HalfInterval;
        else if (output <= -HalfInterval)
                output = -HalfInterval;
        else
                output = output;

*Output++ = output;
        oldrfgain = rfgain;
        oldoutput = output;
        printf("---------------------IFend----------------\n");
ENDLOOP
}
```

FIG. 11B

METHOD AND APPARATUS FOR ADJUSTING THE GAIN OF AN IF AMPLIFIER IN A COMMUNICATION SYSTEM

CROSS-REFERENCE TO RELATED APPLICATIONS

The present invention is related to U.S. patent application Ser. No. 09/795,726, filed Feb. 28, 2001, entitled "Method and Apparatus for Recovering Timing Information in Orthogonal Frequency Division Multiplexing (OFDM) Systems," U.S. patent application Ser. No. 09/795,727, filed Feb. 28, 2001, entitled "Carrier Frequency Acquisition Method and Apparatus Having Improved Reliability for Detecting Carrier Acquisition or Loss Thereof," U.S. patent application Ser. No. 09/382,847, filed Aug. 25, 1999, entitled "Orthogonal Frequency Division Multiplexed (OFDM) Carrier Acquisition Method," and U.S. patent application Ser. No. Ser. No. 09/398,502, filed Sep. 17, 1999, entitled "Method and Apparatus for Performing Differential Modulation Over Frequency in an Orthogonal Frequency Division Multiplexing (OFDM) Communication System," each incorporated by reference herein.

FIELD OF THE INVENTION

The present invention relates to wireless communication systems, and more particularly, to methods and apparatus for automatic gain control in an orthogonal frequency division multiplexing (OFDM) communication system or another communication system.

BACKGROUND OF THE INVENTION

Satellite broadcasting systems transmit digital music and other information from an uplink station to one or more mobile receivers. Satellite broadcasting systems typically include a plurality of satellites and terrestrial repeaters operating in a broadcast mode. The satellites are typically geostationary, and are located over a desired geographical coverage area. The terrestrial repeaters typically operate in dense urban areas, where the direct line of sight (LOS) between the satellites and the mobile receiver can be blocked due to the angle of elevation and shadowing by tall buildings.

Orthogonal frequency division multiplexing (OFDM) techniques have been proposed for use in such satellite broadcasting systems and other wireless networks. In an OFDM communication system, the digital signal is modulated to a plurality of small sub-carrier frequencies that are then transmitted in parallel. It has been found that OFDM communication systems do not require complex equalizers, even at high data rates and under multipath propagation conditions. Among other benefits, OFDM communication systems provide a guard interval that absorbs the multipath distortion into the guard interval duration. As long as the arrival times of the multipath signals differ from one another by less than the guard interval, an equalizer is not necessary.

OFDM communication systems are especially sensitive to clipping. In an OFDM communication system, automatic gain control (AGC) mechanisms are an important part of the system design. The automatic gain control mechanisms must provide an analog-to-digital converter with sufficient signal resolution capabilities so that the received analog signal can be represented with sufficient integrity in the digital domain. Designing an effective automatic gain control circuit for use in the environment of an OFDM communication system, however, is challenging due to the large range of channel gains that occur due to long-term or shadow fading. In addition, OFDM receivers often suddenly receive or lose a line-of-sight signal while turning a corner (causing a sudden power increase or decrease on the order of 20 dB). In addition, OFDM receivers often encounter significant interference from the terrestrial repeaters of competitors. Finally, temperature and device variations provide additional challenges.

A need exists for an automatic gain control technique that maintains the received signal quality after analog-to-digital conversion. A further need exists for an automatic gain control technique that performs automatic gain control that maintains linearity throughout the receiver components. Yet another need exists for an automatic gain control technique that performs automatic gain control that reduces clipping and underflow in the analog-to-digital converter.

SUMMARY OF THE INVENTION

Generally, an automatic gain control technique is disclosed for adjusting the gain of an IF amplifier in a communication system, such as an OFDM or discrete multi-tone (DMT) communication system. The disclosed automatic gain control technique maintains the digital signal quality after analog-to-digital conversion and maintains linearity throughout the receiver components.

An exemplary OFDM receiver includes an RF amplifier and an IF amplifier. The gain of the RF amplifier is controlled by a known RF automatic gain control circuit that generates an RF gain value. The gain of the IF amplifier is controlled in accordance with the present invention by a novel IF automatic gain control circuit (AGC) in accordance with an IF gain value. The disclosed IF AGC monitors the RF gain value, as well as signal energy measurements performed before and after a fast Fourier transform (FFT) stage where the signal is converted from the time domain to the frequency domain, referred to herein as pre-FFT and post-FFT measurements, in order to maintain the desired set point. Generally, the pre-FFT and post-FFT measurements are computed as the sum over n values of the squares of the real and imaginary portions of the OFDM samples, where n corresponds to the inverse of the update rate (UR).

The disclosed IF AGC adjusts the IF gain value by an amount approximately opposite to any adjustment to the RF gain value. If the RF AGC does not adjust the RF gain, then the IF AGC will adjust the IF gain based on the monitored pre-FFT and post-FFT measurements to maintain a corresponding set point. Thresholds are established for the pre-FFT and post-FFT measurements in order to, e.g., maximize the number of bits representing each sample and to prevent clipping. The disclosed IF AGC adjusts the IF gain value by an amount based on the signal energy measurements before and after the FFT stage and the corresponding thresholds.

A more complete understanding of the present invention, as well as further features and advantages of the present invention, will be obtained by reference to the following detailed description and drawings.

BRIEF DESCRIPTION OF THE DRAWINGS

FIG. 8 illustrates the sub-carrier assignment utilized by the MODSC algorithm as generated by the Fast Fourier Transform (FFT) stage of FIG. 3;

FIG. 10 is a flow chart describing an exemplary IF automatic gain control process implemented by the IF AGC stage shown in FIG. 2; and FIGS. 11A and 11B, collectively, illustrate exemplary pseudo-code for performing IF automatic gain control in accordance with the present invention.

DETAILED DESCRIPTION

Figure 1:
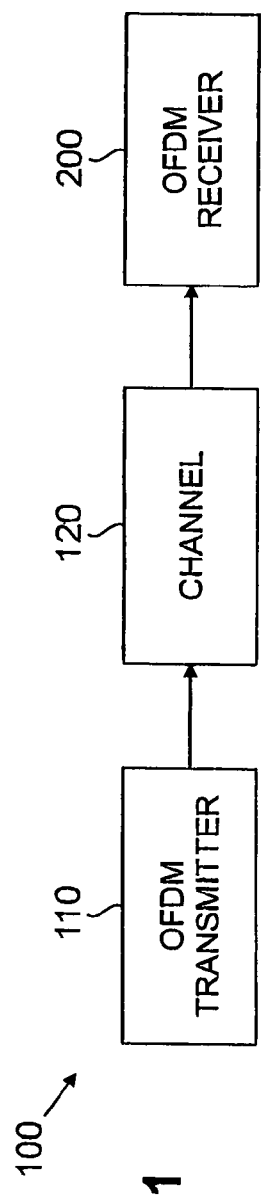
FIG. 1 is a schematic block diagram illustrating an exemplary communication system.

The automatic gain control techniques of the present invention are illustrated in connection with an exemplary OFDM communication system. Although described in connection with an exemplary wireless OFDM communication system, it will be understood that the present invention is equally applicable to a wired discrete multi-tone (DMT) communication system. FIG. 1 illustrates an exemplary OFDM communication system 100 that includes an OFDM 110 transmitter and OFDM receiver 200, discussed further below in conjunction with FIG. 2, that communicate over a channel 120.

OFDM Terminology and Signal Parameters

Generally, in an exemplary OFDM communication system, a digital signal is transmitted as a plurality of parallel sub-carries (also known as "bins"). Collectively, these sub-carriers are referred to as an OFDM "symbol." However, only some of the sub-carriers actually contain information about the signal, referred to as "active sub-carriers." The remaining sub-carriers are nulled, i.e., filled with zeroes, and thus, are referred to as "inactive sub-carriers." An inverse Fast Fourier Transform (IFFT) of a significantly longer length than the number of active sub-carriers is then used to encode the signal for transmission to an OFDM receiver. In particular, the IFFT length is maintained at twice the number of sub-carriers in order to properly reproduce the highest frequency sub-carriers and avoid the effects of aliasing.

In the illustrative embodiment, each OFDM symbol of duration Ts will be composed of 2048 samples corresponding to the useful symbol duration and 184 samples corresponding to the guard interval, and the symbol represents up to 2048 sub-carriers each spaced 4 kHz apart ($\Delta f$). The useful OFDM symbol duration, Tu, illustratively equals 250 µ-sec and the guard interval duration or cyclic prefix duration, Tg, illustratively equals 22.46 µ-sec. The duration of the symbol, Ts, is 272.46 µ-sec, where Ts equals Tu plus Tg. The inter-carrier spacing, $\Delta f$, of 4 KHz is equal to the inverse of the useful symbol duration (1/Tu).

As discussed further below, the OFDM transmitter 110, shown in FIG. 1, implements an exemplary carrier offset estimation technique. Thus, the OFDM transmitter 110 must place a spectral null in the center of the transmit spectrum. For details of an exemplary OFDM transmitter 110, see U.S. patent application Ser. No. 09/795,727, filed Feb. 28, 2001, entitled "Carrier Frequency Acquisition Method and Apparatus Having Improved Reliability for Detecting Carrier Acquisition or Loss Thereof," incorporated by reference herein.

Figure 2:
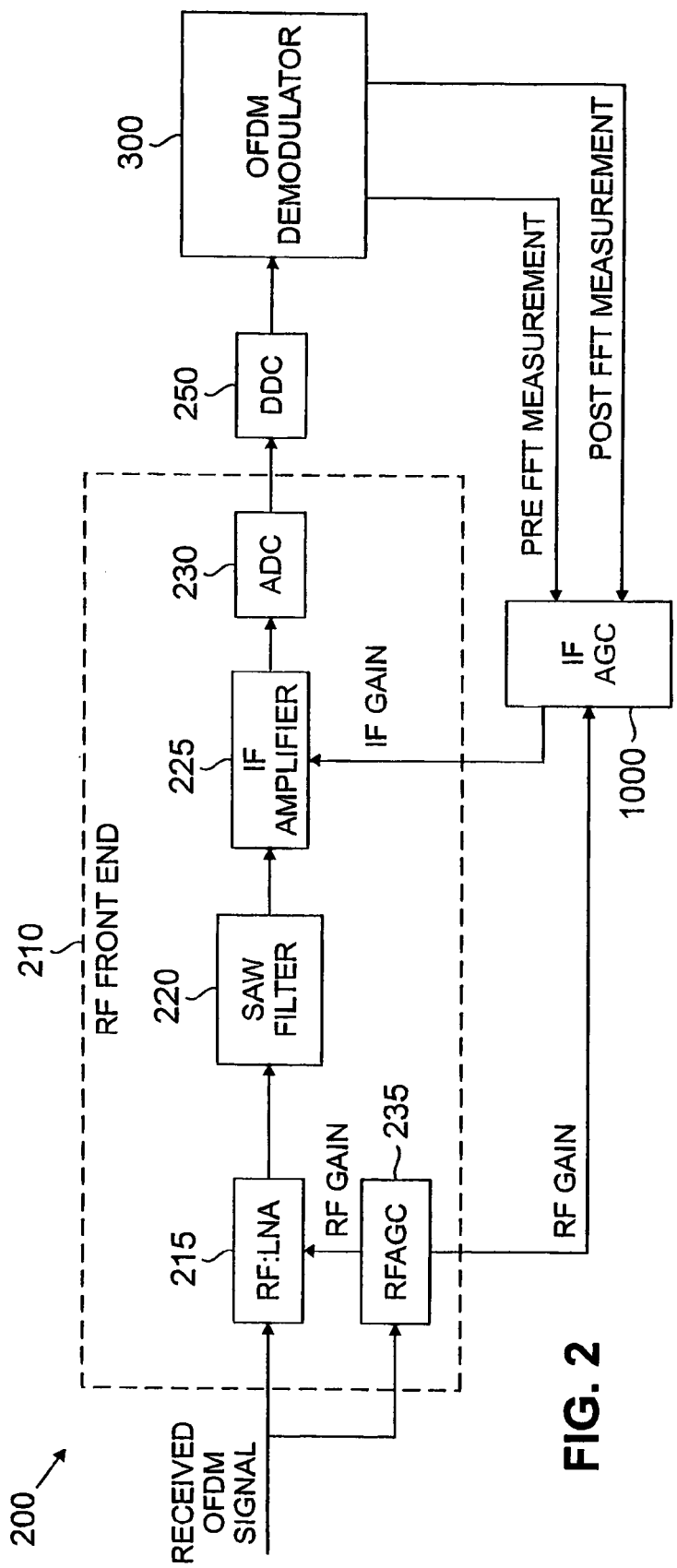
FIG. 2 is a schematic block diagram illustrating an exemplary OFDM receiver in which the present invention can operate.

FIG. 2 is a block diagram illustrating an exemplary OFDM receiver in accordance with the present invention. It will be understood that, in a wireless system, the receiver may be located in a handset, a base station or the like. As shown in FIG. 2, the received OFDM signal is applied to an RF front end stage 210. Initially, the received OFDM signal is processed by an RF stage having a low noise amplifier (LNA) 215. The gain of the low noise amplifier (LNA) 215 is controlled by an RF automatic gain control circuit 235 that generates an RF gain value, in a manner discussed further below in a section entitled RF Automatic Gain Control. The RF AGC circuit 235 may be embodied, for example, in accordance with the teachings of U.S. patent application Ser. No. 09/677,008, filed Sep. 29, 2000, entitled "Constant Compression Automatic Gain Control Circuit," incorporated by reference herein.

Figure 3:
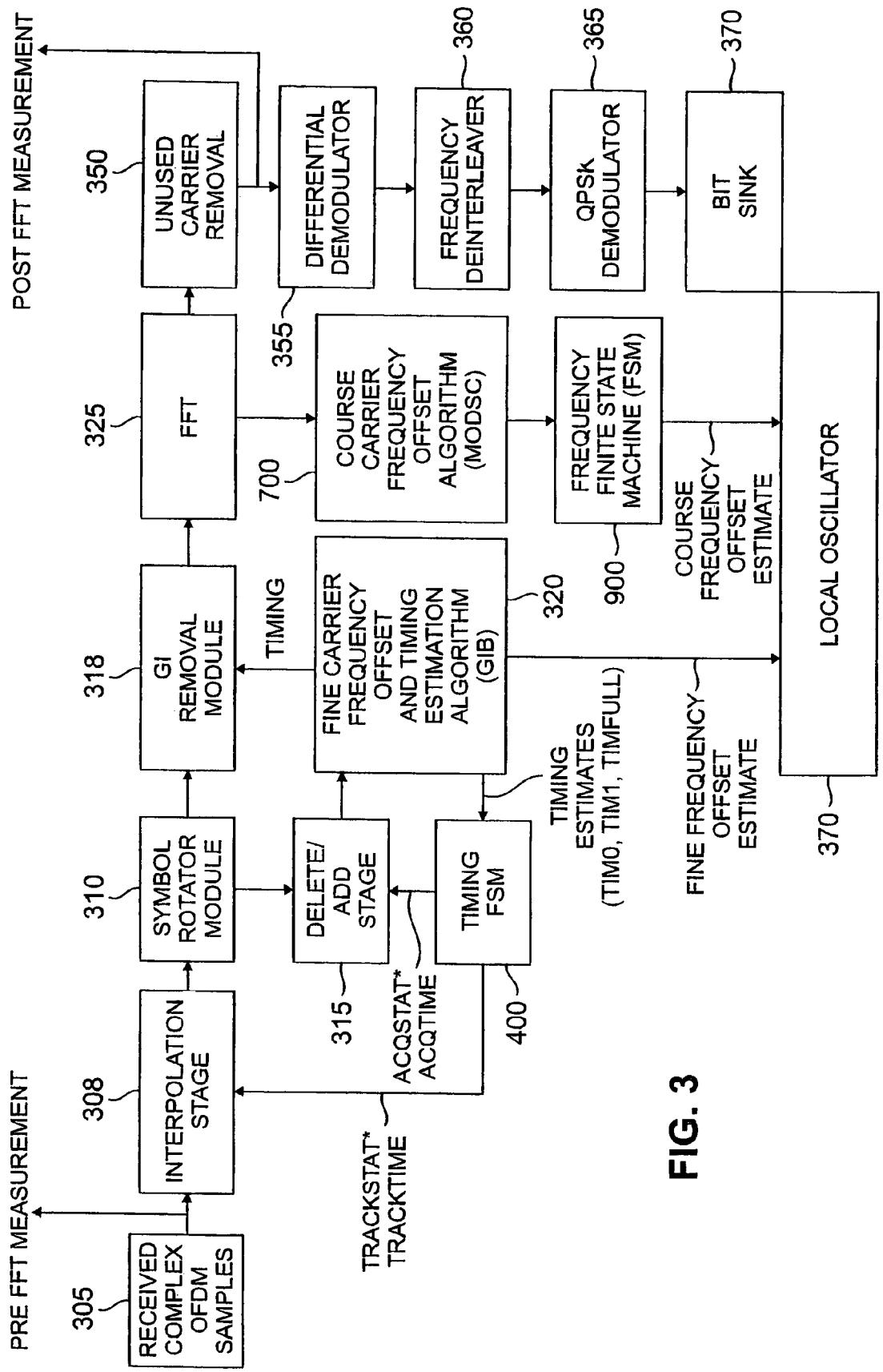
FIG. 3 is a schematic block diagram illustrating the OFDM demodulator of FIG. 2 in further detail.

The amplified OFDM signal is then filtered by a filter 220, and again amplified by an IF amplifier 225. The gain of the IF amplifier 215 is controlled by an IF automatic gain control circuit 1000, discussed further below in conjunction with FIG. 10, that is the primary focus of the present invention. Generally, the IF automatic gain control circuit 1000 monitors the RF gain value, as well as the pre-FFT and post-FFT signal energy measurements performed before and after an FFT stage 325 in the OFDM demodulator 300 (FIG. 3). Generally, the pre-FFT and post-FFT measurements are computed as the sum over n values of the squares of the real and imaginary portions of the OFDM samples, where n corresponds to the inverse of the update rate (UR).

In the exemplary implementation, the IF AGC 1000 will adjust the previous IF gain value by an amount opposite to the RF gain value, if the RF AGC 235 adjusts the RF gain. If the RF AGC 235 does not adjust the RF gain, then the IF AGC 1000 will adjust the IF gain based on the pre-FFT and post-FFT measurements. Thresholds are established for the pre-FFT and post-FFT measurements that maximize the number of bits representing each sample and to prevent clipping. If the pre-FFT measurement is within a desired tolerance of the pre-FFT threshold, then the IF gain will be lowered in stepped increments. Otherwise, the IF gain adjustment is the minimum of the difference between (i) the pre-FFT measurement and its threshold, or (ii) the post-FFT measurement and its threshold, multiplied by a loop gain constant.

The IF signal is then downconverted by a digital downconverter (DDC) 250 to baseband. The output of the DDC 250 then goes into an OFDM Demodulator 300, discussed further below in conjunction with FIG. 3. Generally, the OFDM Demodulator 300 performs (i) timing acquisition adjustment, (ii) LO offset adjustment, (iii) CP Removal, (iv) FFT, (v) unused carrier removal, (vi) timing FSM, (vii) frequency FSM, and (viii) MODSC calculations.

As discussed further below, the OFDM Demodulator 300 provides two signals, pre-FFT measurement and post FFT measurement, that are fed back to the IF AGC 1000. As shown in FIG. 2, the IF AGC 1000 also receives the RF gain value computed by the RF automatic gain control circuit 235. As discussed below, the three signals are used in determining the IF Gain in accordance with the present invention that is applied to the IF amplifier 225 in the RF front end 210. FIG. 3 illustrates exemplary timing and carrier frequency acquisition methods.

Timing Acquisition And Tracking

The OFDM receiver 200 employs exemplary timing acquisition and tracking methods that reposition the peaks in an ML metric at a desired position away from the frame boundary in order to perform improved timing acquisition and tracking. Each OFDM frame is optionally divided into at least two windows in order to identify the index within each window having the maximum correlation. In this manner, the OFDM receiver can properly acquire the timing so that the Fast Fourier Transform (FFT) can operate on the correctly aligned symbol. Generally, this timing estimate must be free from any ambiguity that is larger than the guard interval duration. In addition, the timing must be properly tracked so that the FFT receives properly aligned symbols. The tracking position is moved from the frame boundary so that the probability of timing ambiguity is minimized. In addition, a mechanism is employed for declaring when timing is acquired or when timing has been lost.

As shown in FIG. 3, the received complex baseband OFDM samples 305 are processed to obtain the pre-FFT measurements applied to the IF automatic gain control circuit 1000. Generally, the pre-FFT measurements provide a measure of the energy of the OFDM samples. The pre-FFT measurements are computed as the sum over n values of the squares of the real and imaginary portions of the OFDM samples, where n corresponds to 1/update rate. The received complex baseband OFDM samples 305 are also applied to an interpolation stage 308 that uses the time tracking signal generated by the timing FSM 400 during the tracking mode to simultaneously adjust the timing (maintain alignment with desired position, DesiredPos) and down-sample the signal to twice the oversampling rate. During the acquisition mode, the value of the TRACKSTAT value is 0, so the interpolation block 308 is inactive. During the tracking mode, however, the value of the TRACKSTAT value is 1, so the interpolation block 308 serves to shift the peak in accordance with the number of samples indicated by the variable, TRACKTIME.

The output of the interpolation block 308 is rotated by the integrated phase due to the local oscillator carrier offset in Symbol Rotator Module 310. The delete/add block 315 is used during the acquisition mode only for acquisition or re-acquisition purposes. The number of samples that are added to or deleted from the sample stream by the add/delete block 315 is dictated by the timing estimate after the acquisition is complete, discussed below, in accordance with the variable ACQTIME. During the tracking mode, the value of the ACQSTAT variable is 0, so the add/delete block 315 is inactive. During the acquisition mode, however, the value of the ACQSTAT value is 1 for one frame while the add/delete block 315 is active, so the add/delete block 315 serves to shift the peak to the desired position, DesiredPos, in accordance with the number of samples indicated by the variable, ACQTIME. The following table summarizes the values of the status bits during the various operating modes:

|  | ACQSTAT | TRACKSTAT |
| --- | --- | --- |
| Acquisition Mode | 1 (for 1 frame, otherwise 0) | 0 |
| Inter-Mode Settling Period | 0 | 0 |
| Tracking Mode | 0 | 1 |

As discussed above, the exemplary carrier frequency acquisition method is used to estimate and correct the initial local oscillator carrier offset (course) for the OFDM signal in the exemplary OFDM system. As previously indicated, the output of the interpolation block 308 is rotated by the integrated phase due to the local oscillator carrier offset in Symbol Rotator Module 310. These samples are then sent to the GI Removal Module 318 where the guard interval is removed. The samples are applied to the FFT operation 325, and the carrier acquisition process begins. As previously indicated, the carrier acquisition process employs a course carrier frequency offset algorithm (MODSC) 700 as well as a conventional fine carrier frequency offset and timing estimation algorithm (GIB) 320. The MODSC algorithm 700 estimates large offsets that are multiples of the carrier spacing (4 KHz) that may occur at system startup. The GIB algorithm 320 must identify a local oscillator carrier offset within one half the inter-carrier spacing.

As discussed further below in conjunction with FIGS. 7 and 9, the course frequency offset generated by the MODSC algorithm is further processed by a frequency finite state machine (FSM) 900 to ensure the reliability of the course carrier frequency offset and of transitions between acquisition and tracking modes. The fine and course frequency offsets generated by the GIB and MODSC algorithms 320, 700, respectively, are applied to the local oscillator 370 to control the tracking of the carrier frequency.

OFDM Carrier Acquisition

In the exemplary embodiment, the OFDM receiver 200, discussed below in conjunction with FIG. 2, employs a course carrier frequency offset algorithm, as well as a conventional fine carrier frequency offset algorithm. As discussed hereinafter, the course carrier frequency offset algorithm may be embodied as the MODSC algorithm and can estimate large offsets that are multiples of the carrier spacing (4 KHz) that may occur at system startup. The fine carrier frequency offset algorithm must identify a local oscillator carrier offset within one half the inter-carrier spacing. Thus, the fine carrier frequency offset algorithm can detect the carrier offset and correct the local oscillator even when the spectral null moves to the middle of the sub-carrier spacing.

Thus, if the local oscillator moves the spectrum by one half of the inter-carrier spacing (2 KHz in the exemplary OFDM communication system), the MODSC algorithm will not be able to detect the null at the output of the FFT. Once the offset moves sufficiently away from the middle of the sub-carrier separation, the MODSC algorithm can detect the integral part of the offset and remove the inherent ambiguity equal to the inter-carrier spacing (4 KHz in the exemplary embodiment) due to the $2\pi$ periodicity of the fine carrier tracking estimate. Therefore, the course and fine carrier frequency offset algorithms work together in estimating the local oscillator carrier offset more quickly and with greater accuracy than the carrier tracking algorithm alone.

The fine carrier frequency offset algorithm may be embodied, for example, as the well-known Guard Interval Based (GIB) algorithm described in, e.g., Jan-Jaap van de Beek et al., ML Estimation of Time and Frequency Offset in OFDM Systems, IEEE Transactions on Signal Processing, Vol. 45, No 7, 1800-05 (July 1997) or Jan-Jaap van de Beek et al., "A Time and Frequency Synchronization Scheme for Multiuser OFDM," IEEE J. on Selected Areas in Communications, Vol. 17, No. 11, 1900-14, (November 1999), each incorporated by reference herein. In addition, the manner in which the MODSC course carrier frequency offset algorithm and the fine carrier frequency offset algorithm cooperate to estimate the local oscillator carrier offset is described in U.S. patent application Ser. No. 09/382,847, filed Aug. 25, 1999, entitled "Orthogonal Frequency Division Multiplexed (OFDM) Carrier Acquisition Method," incorporated by reference herein. Since the fine carrier frequency offset algorithm is not the focus of the present invention, the reader is referred to these references for a more detailed discussion.

As previously indicated, the guard interval is removed from the samples corresponding to the sub-carriers of the OFDM symbol by GI Removal Module 318 to obtain N*Os sub-carriers. The symbol is then applied to an FFT 325 of length L equal to N*Os for conversion from the time domain to the frequency domain. As discussed above, for purposes of carrier acquisition, a null will be present in the center of the spectrum if the receiver is tuned to the transmit carrier. After the FFT is performed, the inactive sub-carriers are discarded by unused carrier removal module 350, and the complex elements d[n] are sent to a differential demodulator 355. Demodulation results in active sub-carriers c[n]=d[n]d*[n−1]. The active sub-carriers are then sent to a frequency de-interleaver 360 and thereafter to a QPSK demodulator 365. After QPSK de-modulation, the digital bits are sent to a data sink 370 for application-specific processing.

As shown in FIG. 3, the outputs of the unused carrier removal stage 350 provide the post-FFT measurements applied to the IF automatic gain control circuit 1000. Generally, the post-FFT measurements provide a measure of the energy of the OFDM samples following the FFT. The post-FFT measurements are computed as the sum over n values of the squares of the real and imaginary portions of the transformed samples, where n corresponds to 1/update rate.

Figure 4:
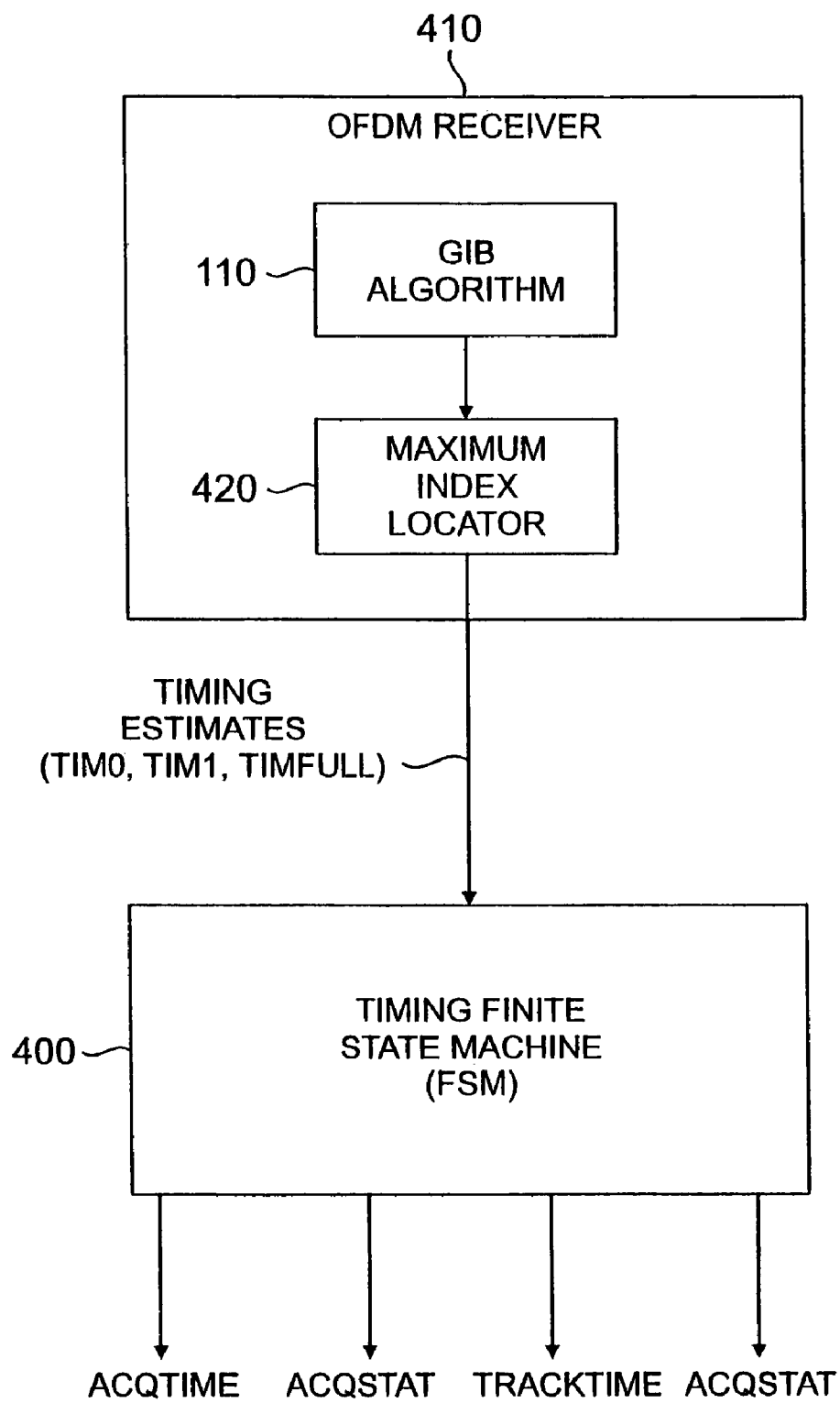
FIG. 4 is a schematic block diagram illustrating portions of the OFDM receiver and timing finite state machine of FIG. 3 in further detail.

FIG. 4 illustrates portions of an OFDM receiver 410 directed to timing recovery. The OFDM receiver 410 implements the well-known Guard Interval Based (GIB) algorithm 320 that recovers timing information from the received signal. For a more detailed discussion of the GIB timing recovery algorithm 320, see, for example, Jan-Jaap van de Beek et al., ML Estimation of Time and Frequency Offset in OFDM Systems, IEEE Transactions on Signal Processing, Vol. 45, No 7, 1800-05 (July 1997) or Jan-Jaap van de Beek et al., "A Time and Frequency Synchronization Scheme for Multiuser OFDM," IEEE J. on Selected Areas in Communications, Vol. 17, No. 11, 1900-14, (November 1999), each incorporated by reference herein.

As previously indicated, the GIB timing recovery algorithm 320 identifies peaks in a maximum likelihood (ML) metric. The exemplary timing recovery technique repositions each peak away from the frame boundary in order to perform improved timing acquisition and tracking. In the illustrative embodiment described herein, the peaks are shifted from the frame boundary to the center of the OFDM frame, thereby removing the ambiguity of whether a given peak is associated with a previous or subsequent frame. As discussed further below, peaks are shifted by inserting or deleting samples, as necessary, into each OFDM frame. As shown in FIG. 4, the timing information is extracted from the GIB algorithm 320 by a maximum index locator 420 that locates indices having maximum correlation values. For a discussion of alternatives to the GIB algorithm, see Kim et al., Performance Comparison of the Frequency Detectors for Orthogonal Frequency Division Multiplexing, IEEE Trans. Consumer Electronics, Vol. 43, No. 3, 776: 783 (August 1997), incorporated by reference herein.

In the illustrative embodiment, each OFDM frame is divided into two windows and an index corresponding to the maximum correlation value in each window is selected, as well as an index corresponding to the maximum correlation value in the overall OFDM frame. Thus, as shown in FIG. 4, the illustrative maximum index locator 420 generates three timing estimate values, namely, $tim_0$, $tim_1$ and $tim_{full}$. The variables $tim_0$, and $tim_1$, are the indices for the maximum correlation in a first window and a second window of the 2232-sample buffer, respectively. Finally, the variable $tim_{full}$ indicates the index for the maximum correlation in the 2232-sample buffer.

The timing estimates, $tim_0$, $tim_1$ and $tim_{full}$, are applied to a timing finite state machine (FSM) 400, discussed below in conjunction with FIG. 6, that determines when the timing information has been acquired and shifts the OFDM signal, as necessary, to maintain the peak in the desired position during a tracking mode. In the illustrative embodiment, each peak is maintained in the center position of the OFDM frame (sample position 1116). As discussed further below, the timing FSM 400 provides reliable transitions between the acquisition and tracking modes of operation.

Generally, during the acquisition mode, the timing FSM 400 sets the variable acquisition status, ACQSTAT, to a binary value of one (1) for one frame when the delete/add stage 315 is active. In addition, the timing FSM 400 aligns the peak of the correlated OFDM signal with the desired position of the OFDM frame, DesiredPos (the central position, 1116, in the illustrative embodiment) using the variable ACQTIME. The desired position is selected such that after acquisition the ideal timing instant will be positioned away from the frame boundary, thus minimizing edge ambiguities. For every OFDM frame, the timing FSM 400 also compares the time estimates from the GIB algorithm 320 with the previous time estimates for the previous frame. If the differences are less than the length of the guard interval consecutively for a pre-defined timing acquisition length, TacqLen, such as five (5) frames in the illustrative embodiment, then timing acquisition is completed. After a predefined inter-mode settling period, the timing FSM will transition to a tracking mode.

Similarly, during the tracking mode, the timing FSM 400 sets the variable tracking status, TRACKSTAT, to a binary value of one (1). While in the tracking mode, the timing FSM 400 compares the estimated times with the desired position of the OFDM frame, DesiredPos (sample position 1116). For every OFDM frame, the timing FSM 400 also compares the time estimates from the GIB algorithm 320 with the previous time estimates for the previous frame. The peak of the correlated OFDM signal is maintained in the desired position of the OFDM frame, DesiredPos, using the variable TRACKTIME. If the differences between the estimated times and the desired position of the OFDM frame are consistently greater than the length of the guard interval, then a loss of tracking is achieved and the timing FSM 400 will return to an acquisition mode.

Figure 5A:
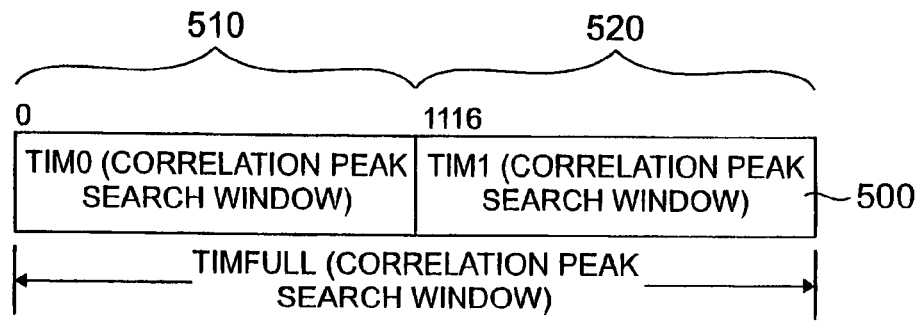
FIGS. 5A, 5B and 5C illustrate a sliding window correlation of the GIB algorithm and the selection of the maximum values by a maximum index locator of FIG. 4 in accordance with an illustrative embodiment.
Figure 5B:
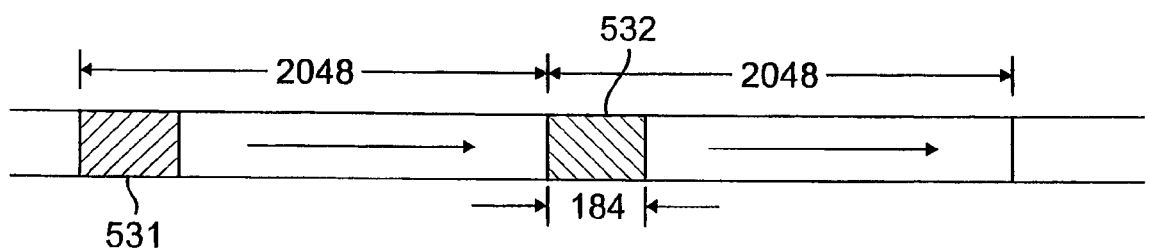
Figure 5C:
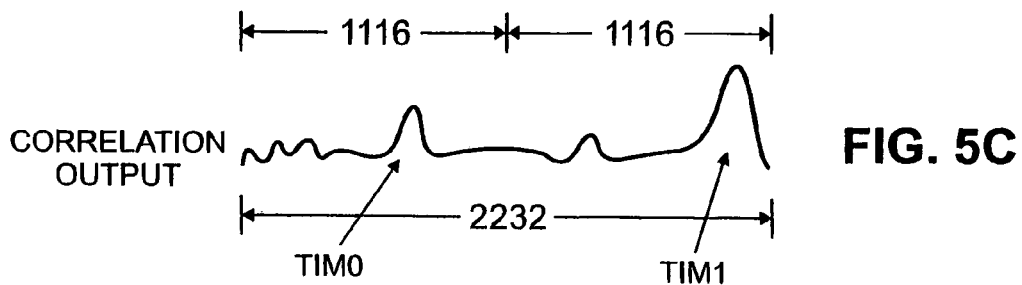

FIGS. 5A, 5B and 5C illustrate the sliding window correlation of the GIB algorithm 110, and the selection of the maximum values by the maximum index locator 420 in accordance with an illustrative embodiment. As previously indicated, the samples processed by the GIB algorithm 110 are heavily correlated at a lag of the useful symbol duration (2048 samples in the illustrative implementation). This correlation is accomplished by the moving average blocks in the GIB algorithm 110 that generate the sum of the most recent 184 samples fed to the moving average blocks (not shown). The timing information is extracted by locating indices of the maximum correlation value in various windows of a buffer that is 2232 samples wide.

As shown in FIG. 5A, each OFDM frame 500 consisting of 2232 samples in the illustrative embodiment (2048 active samples, and a guard interval of 184 samples), is divided into a first window 510 and a second window 520. The timing estimate $tim_0$ is the index for the maximum correlation in the first window 510 of the 2232-sample buffer. The timing estimate $tim_1$ is the index for the maximum correlation in the second window 520 of the 2232-sample buffer. Finally, the timing estimate $tim_{full}$ indicates the index for the maximum correlation in full 2232-sample buffer corresponding to the entire OFDM frame. FIG. 5B illustrates the correlation of the 184 guard interval samples 531, 532 in two subsequent OFDM frames. Each 184 guard interval sample 531, 532 is 2232 samples apart. The correlation process is repeated to get the 2232 sample correlation output, as shown in FIG. 5C.

Figure 6:
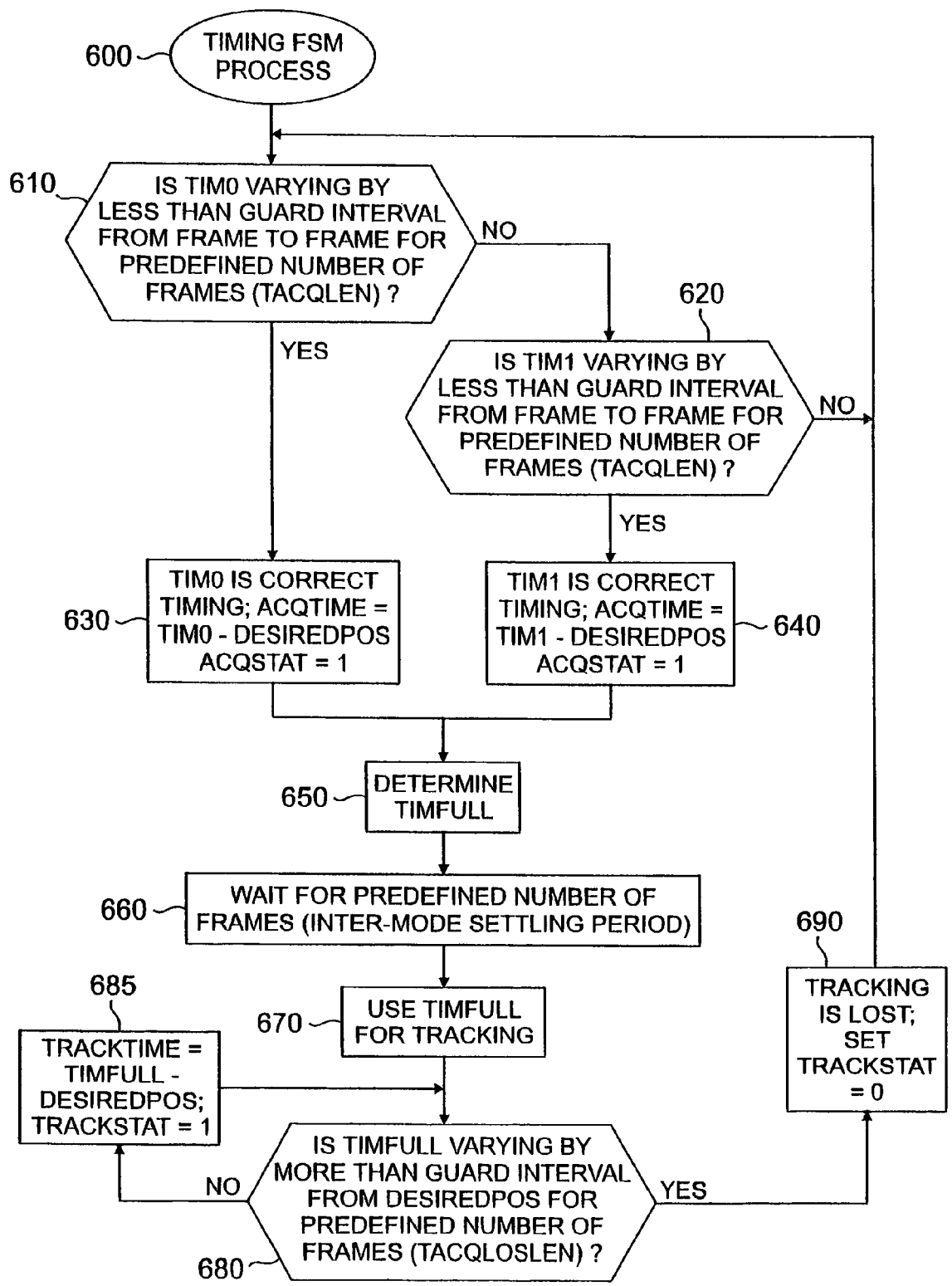
FIG. 6 is a flow chart describing a timing FSM process implemented by the receiver shown in FIG. 4.

FIG. 6 is a flow chart describing the timing FSM process 600 implemented by the receiver 410 shown in FIG. 4. As shown in FIG. 6, the timing FSM process 600 initially performs a test during step 610 to determine if the timing estimate, tim0, varies by less than the guard interval from frame to frame for a predefined number (tacqlen) of frames. If it is determined during step 610 that the timing estimate, tim0, varies by less than the guard interval from frame to frame for a predefined number (tacqlen) of frames then the timing estimate, tim0, is the correct timing, the variable ACQTIME is established as the difference between the timing estimate, tim0, and the desired position, DesiredPos, and the status bit ACQSTAT is set to one (indicating the acquisition mode) during step 630.

If, however, it is determined during step 610 that the timing estimate, tim0, does not vary by less than the guard interval for a predefined number (tacqlen) of frames then a further test is performed during step 620 to determine if the timing estimate, tim1, varies by less than the guard interval for a predefined number (tacqlen) of frames. If it is determined during step 620 that the timing estimate, tim1, varies by less than the guard interval for a predefined number (tacqlen) of frames then the timing estimate, tim1, is the correct timing, the variable ACQTIME is established as the difference between the timing estimate, tim1, and the desired position, DesiredPos, and the status bit ACQSTAT is set to one (indicating the acquisition mode) during step 640.

The variable $tim_{full}$ indicating the index for the maximum correlation in the 2232-sample buffer, is determined during step 650. Thereafter, the timing FSM process 600 waits for a predefined number of frames during step 660 to permit the timing FSM 450 to settle. The variable $tim_{full}$ is established as the timing estimate during step 670. A test is performed during step 680 to determine if the timing estimate, timfull, varies by more than the guard interval from the desired position, DesiredPos, for a predefined number (tacqloslen) of frames. If it is determined during step 680 that the timing estimate, timfull, varies by more than the guard interval from the desired position, DesiredPos, for a predefined number (tacqloslen) of frames, then tracking is lost and the status bit TRACKSTAT is set to a binary value of zero (0) during step 690 and program control returns to step 610 to reacquire timing.

If, however, it is determined during step 680 that the timing estimate, timfull, does not vary by more than the guard interval from the desired position, DesiredPos, for a predefined number (tacqloslen) of frames, then the OFDM frame is realigned with the desired position, DesiredPos, if necessary, and the status bit TRACKSTAT is set to a binary value of one (1) to maintain the timing FSM 400 in the tracking mode during step 685.

Figure 7:
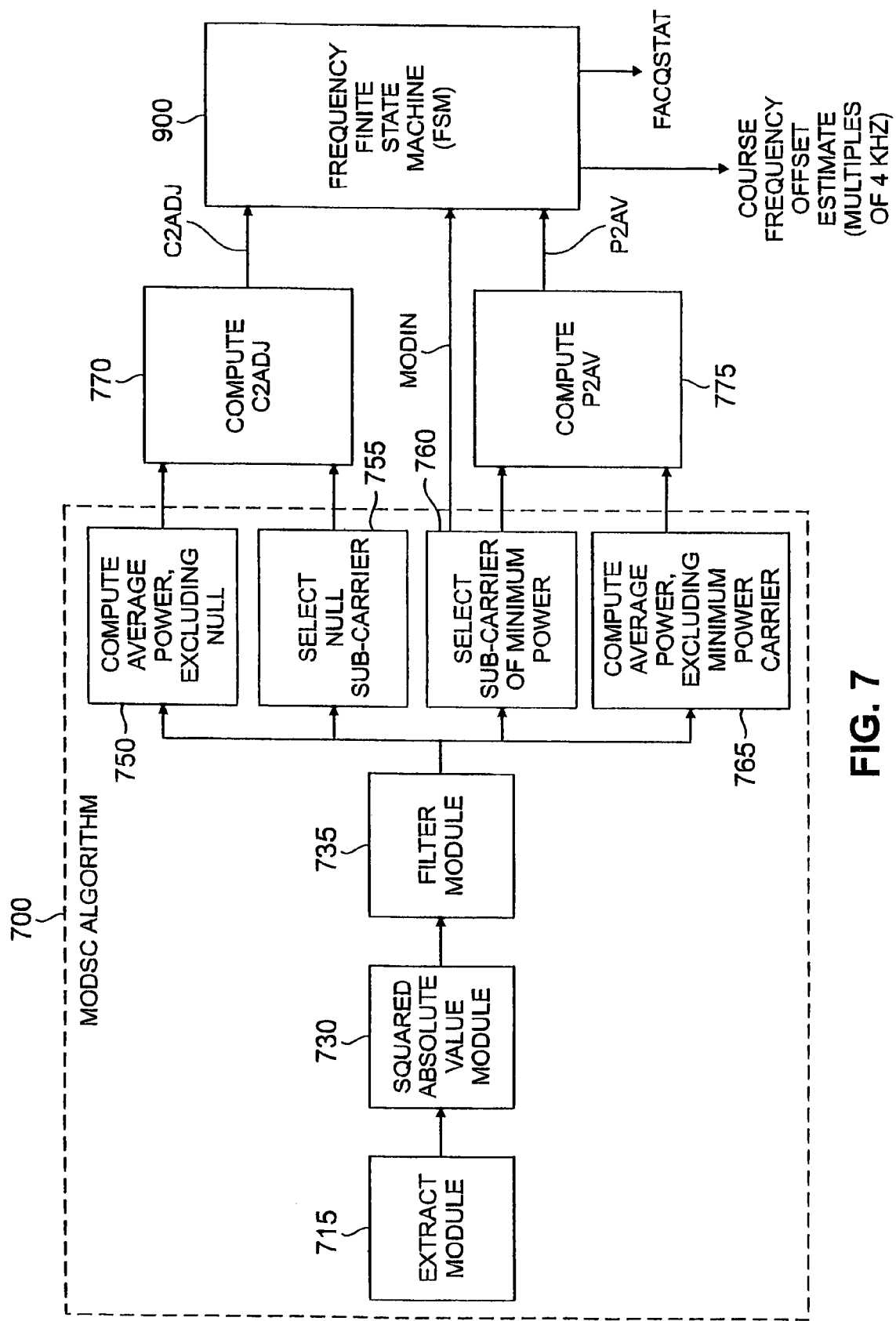
FIG. 7 is a schematic block diagram illustrating the MODSC and frequency FSM blocks of FIG. 3 in further detail.

FIG. 7 is a schematic block diagram illustrating portions of the OFDM receiver dedicated to carrier acquisition. In particular, FIG. 7 illustrates the operation of the MODSC block 700 and frequency FSM block 900 of FIG. 3 in further detail. As shown in FIG. 7, the first step in the MODSC algorithm 700 is the extraction of the appropriate number of sub-carriers in the extract module 715. The extracted FFT sub-carrier bins have integer indices with the central sub-carrier having an index of 0. For example, in a system where 37 sub-carriers are extracted, the sub-carrier bins would have the following indices: −18, −17, . . . −2, −1, 0, 1, 2, . . . 17, 18. The exemplary output of the FFT stage 325 (FIG. 3) is 2078 complex samples. Of these 2078 samples, 37 samples (sub-carrier outputs) are extracted by the extract module 715, as follows:

| | | | |
|---|---|---|---|
| y(k) | = | fft_buffer(k) | 0 <= k <= 18 |
| y(−k) | = | fft_buffer(2078−k) | 1 <= k <= 18 |

In other words, the desired 37 central bins are extracted from sample positions 0 through 18 and 2030 through 2077.

Once the extraction operation is completed, the extracted FFT bins can be observed to locate the null, which indicates the MODSC offset estimate. Specifically, the MODSC algorithm 700 distinguishes whether the local oscillator carrier offset is an integer, i.e., . . . −2, −1, 0, 1, 2 . . . , sub-carriers away from the central position, which is equivalent to . . . −8 KHz, −7 KHz, 0 KHz, 7 KHz, 8 KHz in the exemplary OFDM system. While a per-sub-carrier based operation on all the available sub-carriers can be performed, it is unnecessary. The number of sub-carriers that are needed depends on the parts-per-million (ppm) accuracy of the local oscillator 370 and the carrier frequency. In the exemplary OFDM system, where the local oscillator accuracy is 8 ppm, the per-sub-carrier operations can be constrained to sub-carriers: −7, −3, . . . 0, . . . 3, 7 because 2*M+1 sub-carrier tracking can generally estimate +/−M*(Δf)(Hz).

The absolute values of the extracted FFT outputs are then calculated on a per-sub-carrier basis in the absolute value module 730. Because the location of the null is rendered uncertain by channel noise and fading, the extracted FFT outputs are preferably filtered on a per-sub-carrier basis to remove or mitigate the effects of the channel in the filter module 735, which may be embodied as, e.g., 16-tap moving average filters. After the filtering operation 735, four operations are performed in parallel. More specifically, the average power of the 37 central sub-carriers is computed at stage 750, excluding the power associated with the null carrier (0). The null carrier is selected at stage 755. The sub-carrier having the minimum power is selected during stage 760 (modin) indicating the offset in multiples of sub-carrier spacing. In addition, the average power of the 37 central sub-carriers is computed at stage 765, excluding the power associated with the minimum power carrier (selected at state 760).

Following the various computations performed during stages 750-765 of the MODSC algorithm 700, additional metrics that are utilized by the frequency FSM 900 are computed to improve the reliability of transitions between acquisition and tracking modes. As shown in FIG. 7, a value, c2adj, is computed during stage 770, as follows:

$$c2adj = \left[\frac{F_{ave}}{F_0}\right],$$

where $F_0$ is the null carrier power and $F_{ave}$ is the average power of adjacent carriers. Thus, c2adj is the normalized ratio of average power (excluding null carrier power) of carriers to the null carrier power.

A value, p2av, is computed during stage 775, as follows:

$$p2av = \left[\frac{F_{ave}}{F_{min}}\right],$$

where $F_{min}$ is the minimum carrier power of the 37 central carriers. Thus, p2av is the normalized ratio of average power (excluding minimum carrier power) of carriers to the minimum carrier power.

The exemplary frequency acquisition method provides improved reliability of the course frequency offset estimate and of the transitions between acquisition and tracking modes using a number of thresholds. Thus, as discussed further below in conjunction with FIG. 9, the metric modin generated by the MODSC algorithm 700 is modified to incorporate thresholds based on the metrics c2adj and p2av, as follows:

$$modin_{new} = E \cdot Min\_index \cdot 4 \text{ KHz},$$

where Min_Index is index of the carrier with minimum power, in the range −18 to 18, and $E=1$ if [c2adj≦threshlt1]&[p2av≧threshgt1].aretrue 0 otherwise Thus, if at least one of the conditions fail, the modin expression will evaluate to zero and the frequency offset falls back to the central carrier (zero frequency offset). Generally, if one of the conditions fail, then the signal-to-noise ratio is insufficient to reliably determine the frequency offset.

As shown in FIG. 7, the frequency FSM 900 also generates a signal, FACQSTAT (frequency acquired status) that can be used by other parts of the OFDM receiver to monitor the system state. The output FACQSTAT is a binary value of one (1) in the tracking mode and it is a binary value of zero (0) in the acquisition mode. FIG. 8 illustrates the sub-carrier assignment utilized by the MODSC algorithm as generated by the Fast Fourier Transform (FFT) stage of FIG. 3.

Figure 9:
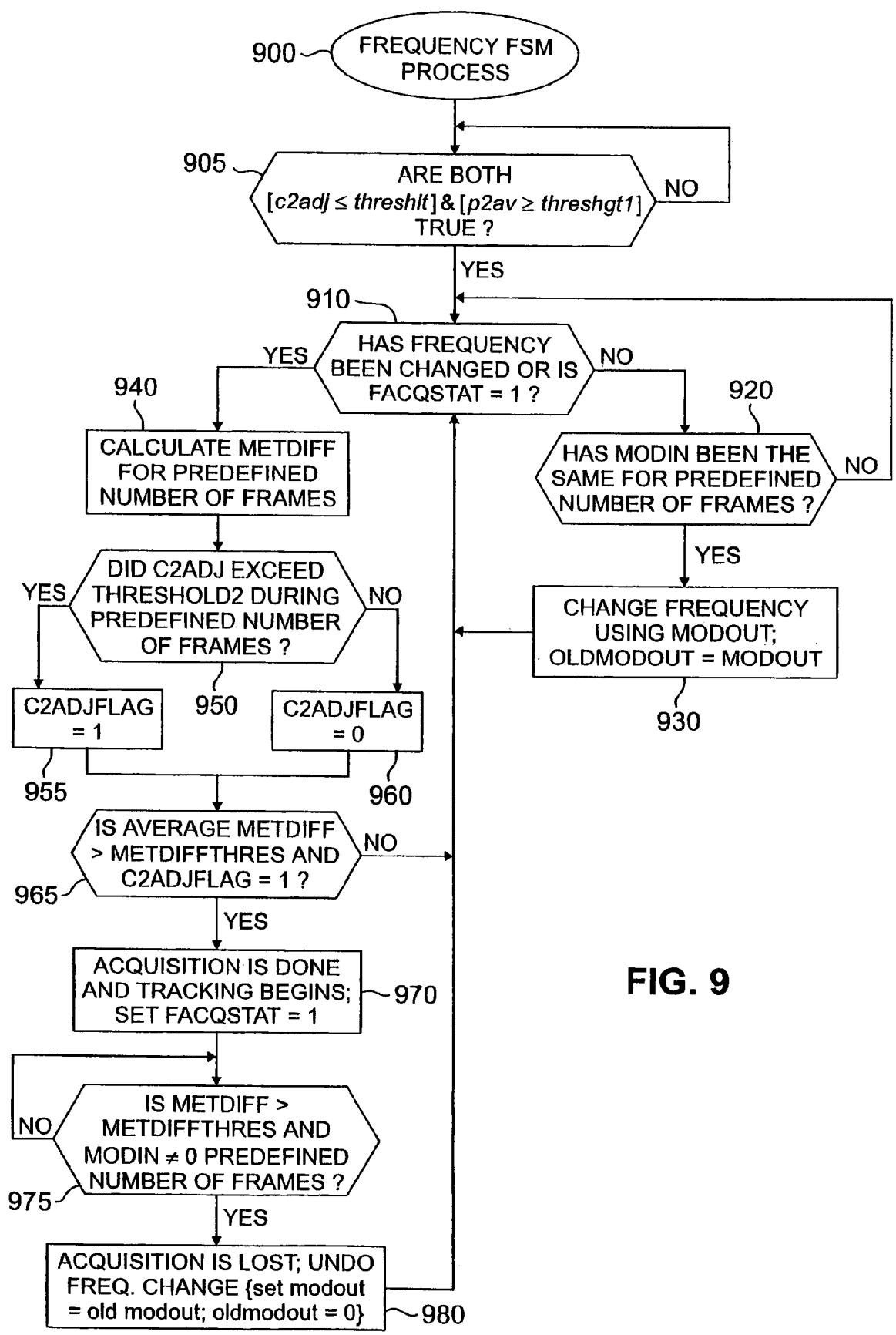
FIG. 9 is a flow chart describing a frequency FSM process implemented by the frequency FSM shown in FIG. 3.

FIG. 9 is a flow chart describing a frequency FSM process 900 implemented by the frequency FSM 900 shown in FIGS. 3 and 7. Generally, the frequency FSM process 900 provides reliable transitions between acquisition and tracking modes. The frequency FSM process 900 uses the ratios of the powers of the carriers (p2av and c2adj) to determine if their averaged difference is less than some predefined threshold. The averaging is done over a fixed number of OFDM frames. If the average difference is less than the predefined threshold, then frequency acquisition is completed. Similarly, while in tracking mode, the difference of the ratios of powers is compared. If the differences are consistently greater than the threshold, then loss of track is achieved and the frequency FSM process 900 will switch operation to the acquisition mode. The output FACQSTAT is a binary value of one (1) in the tracking mode and it is a binary value of zero (0) in the acquisition mode. The modout is same as modin in the tracking mode and it is 0 in the acquisition mode.

Thus, as shown in FIG. 9, the frequency FSM process 900 initially performs a test during step 905 to ensure that the metric values c2adj and p2av satisfy the following condition:

[c2adj≦threshlt]&[p2av≧threshgt1].

If it is determined during step 905 that the metric values c2adj and p2av do not satisfy the specified condition, then the modin value does not have sufficient reliability and program control returns to step 905 until the modin value has sufficient reliability.

If, however, it is determined during step 905 that the metric values c2adj and p2av satisfy the specified condition, then the modin value has sufficient reliability and program control proceeds to step 910 where a test is performed to determine if the frequency has been changed or if FACQSTAT equals one (indicating that acquisition was previously achieved).

If it is determined during step 910 that the frequency has not been changed and FACQSTAT does not equal one, then program control proceeds to steps 920 and 930 to make a frequency change. Thus, a further test is performed during step 920 to determine if modin has been the same for a predefined number of frames. If it is determined during step 920 that modin has not been the same for a predefined number of frames, then program control returns to step 920 until this condition is satisfied.

If, however, it is determined during step 920 that modin has been the same for a predefined number of frames, then the frequency is changed during step 930 using modout, and modout is recorded as oldmodout. Program control then returns to step 910.

If, however, it is determined during step 910 that the frequency has been changed or that FACQSTAT equals one, then a metdiff value is computed during step 940 over a predefined number of frames as the absolute value of the difference between the metric values c2adj and p2av. A test is performed during step 950 to determine if c2adj exceeds a threshold at least once during a predefined number of frames. A more stringent threshold can optionally be applied to c2adj during step 950 than was applied during step 905 since satisfying the threshold will place the FSM in a tracking mode.

If it is determined during step 950 that c2adj does exceed a threshold at least once during a predefined number of frames, then a flag is set during step 955. If, however, it is determined during step 950 that c2adj does not exceed a threshold at least once during a predefined number of frames, then the flag is not set. A further test is performed during step 965 to determine if the average metdiff (calculated during step 940) is greater than a defined threshold and that the c2adj flag has been set. If it is determined during step 965 that the average metdiff is not greater than a defined threshold or the c2adj flag has not been set, then program control returns to step 910 and continues in the manner described above.

If, however, it is determined during step 965 that the average metdiff is greater than a defined threshold and the c2adj flag has been set, then acquisition is complete (null has moved to center) and tracking may begin. The status flag FACQSTAT is set during step 970. A further test is performed during step 975 to again determine if the average metdiff (calculated during step 940) is greater than a defined threshold and modin does not equal zero for a predefined number of frames.

If it is determined during step 975 that the average metdiff is not greater than the threshold or that modin equals zero for a predefined number of frames, then program control returns to step 910 and continues in the manner described above. If, however, it is determined during step 975 that the average metdiff is greater than a defined threshold and modin does not equal zero for a predefined number of frames, then acquisition is lost and the frequency change that was made is undone during step 980, before program control returns to step 910 and continues in the manner described above.

While there are 37 sub-carriers tracked in the exemplary modsc block, all absolute frequency offsets greater than 36000 are ignored by the frequency FSM 900 in the acquisition mode. However, the entire 2*72000 Hz offsets (all 37 sub-carriers) are used in declaring false acquisitions during step 975.

RF Automatic Gain Control

In an exemplary implementation, the RF gain in the low noise amplifier stage 215 is controlled by three devices: LNA1, LNA2, and RF. The on/off states of the low noise amplifiers and the stepped gains of the RF stage (full or half gains) are combined to allow the overall RF stage 215 to have seven states. The gain difference from the highest gain stage to the lowest gain stage is 84 dB (total RF gain limit). The RF AGC circuit 235 may be embodied, for example, in accordance with the teachings of U.S. patent application Ser. No. 09/677,008, filed Sep. 29, 2000, entitled "Constant Compression Automatic Gain Control Circuit," incorporated by reference herein.

The RF automatic gain control circuit 235 calculates the power received from the transmitter every 10/update rate (UR) seconds, such as every 10 milli-seconds in an exemplary embodiment. The RF power is supposed to be calculated 10 times faster than the update rate. The power calculations are then used to set a variable to one of three values (1, 0, or −1). A value of 1 indicates that the power is low and the gain should be increased, a value of −1 indicates that the power is high and the gain should be decreased, and a value of 0 indicates that no change is required. The total RF gain limit can be divided into seven states as follows:

| STATE | Gain Difference from Adjacent State |
| --- | --- |
| state 1 (lowest gain) | 7 |
| state 2 | 14 |
| state 3 | 14 |
| state 4 | 14 |
| state 5 | 14 |
| state 6 | 14 |
| state 7 (highest gain) | 7 |

The RF automatic gain control circuit 235 receives the signal from the transmitter 110. The RF automatic gain control circuit 235 attempts to maintain this signal as close to a desired dBm setpoint as possible. Therefore, if the power calculations indicate that the power is greater than the setpoint, then the direction is set to −1, if the power is less than the setpoint, then the direction is set to 1; otherwise, the direction is set to 0. After a number of such decisions, the majority decision is adopted. The decisions on the directions are also governed by hysterisis in power.

IF Automatic Gain Control

As previously indicated, the gain of the IF amplifier 225 is controlled by the IF automatic AGC 1000 in accordance with an IF gain value. The IF AGC 1000 monitors the RF gain value, as well as the pre-FFT and post-FFT signal energy measurements performed before and after the FFT 325. Again, the pre-FFT and post-FFT measurements are computed as the sum over n values of the squares of the real and imaginary portions of the OFDM samples, where n corresponds to the inverse of the update rate (UR).

FIG. 10 is a flow chart describing an exemplary IF automatic gain control process implemented by the IF AGC stage 101000 shown in FIG. 2. As shown in FIG. 10, the IF automatic gain control process 101000 initially receives the RF gain value, and computes the pre-FFT and post-FFT measurements during step 1010 every 1/UR seconds. A test is then performed during step 1020 to determine if the RF AGC 235 adjusted the RF gain. If it is determined during step 1020 that the RF AGC 235 adjusted the RF gain, then the exemplary IF AGC process 101000 will adjust the previous IF gain value during step 1020 by an amount opposite to the RF gain value.

If, however, it is determined during step 1020 that the RF AGC 235 did not adjust the RF gain, then the IF AGC will adjust the IF gain based on the pre-FFT and post-FFT measurements. Thresholds are established for the pre-FFT and post-FFT measurements that maximize the number of bits representing each sample and to prevent clipping.

A further test is performed during step 1030 to determine if the difference between the pre-FFT threshold and the pre-FFT measurement is greater than a desired tolerance. If it is determined during step 1030 that the pre-FFT measurement is within a desired tolerance, Y, of the pre-FFT threshold, then the IF gain will be lowered in stepped increments during step 1040. In an exemplary implementation discussed below in conjunction with FIG. 10, the gain is corrected in steps of two dB (Y plus two dB). It is noted that there is a wait time associated with using the decisions based on the pre-FFT measurements (when a Y+2 dB power drop occurs). Thus, if the pre-FFT measurement dictates a change at the current instant, then the minimum duration for which the pre-FFT measurements will be ignored will be equal to a parameter, waittime.

If it is determined during step 1030 that the pre-FFT measurement is not within a desired tolerance, Y, of the pre-FFT threshold, then the IF gain adjustment is established during step 1050 as the minimum of the difference between (i) the pre-FFT measurement and its threshold, or (ii) the post-FFT measurement and its threshold, multiplied by a loop gain constant.

FIGS. 11A and 11B, collectively, illustrate exemplary pseudo-code 1100 for performing the IF AGC process 1000 of FIG. 10.

It is to be understood that the embodiments and variations shown and described herein are merely illustrative of the principles of this invention and that various modifications may be implemented by those skilled in the art without departing from the scope and spirit of the invention.

I claim:

1. In a communication receiver, a method for adjusting the gain of an IF amplifier, said method comprising the steps of:
   monitoring a gain adjustment of an RF amplifier in said communication receiver; and
   adjusting said IF gain value based on said monitored RF amplifier gain adjustment by an amount approximately opposite to said RF gain value.

2. The method according to claim 1, wherein said communication receiver is an OFDM communication receiver.

3. The method according to claim 1, wherein said communication receiver is a DMT communication receiver.

4. The method according to claim 1, further comprising the step of adjusting said IF gain value based on at least one signal energy measurement performed before or after a fast Fourier transform (FFT) stage in said receiver in order to maintain a desired set point if there is no RF gain adjustment.

5. The method according to claim 4, wherein said signal energy measurement is a sum over n values of the squares of the real and imaginary portions of signal samples, where n corresponds to an inverse of an update rate (UR).

6. The method according to claim 4, wherein said signal energy measurement is performed before said FFT stage and wherein said method further comprises the step of adjusting said IF gain value in stepped increments if a difference between said signal energy measurement and a corresponding pre-FFT threshold are within a predefined tolerance.

7. The method according to claim 4, wherein said signal energy measurements are performed before and after said FFT stage and wherein said method further comprises the step of adjusting said IF gain value by an amount equal to a minimum of a difference between a pre-signal energy measurement and a corresponding pre-FFT threshold and a difference between a post-signal energy measurement and a corresponding post-FFT threshold multiplied by a constant.

8. The method according to claim 4, wherein a threshold for said signal energy measurement is established to maximize a number of bits representing each sample.

9. The method according to claim 4, wherein a threshold for said signal energy measurement is established to prevent clipping.

10. In a communication receiver, a method for adjusting the gain of an IF amplifier, said method comprising the steps of:

monitoring signal energy measurements before and after a fast Fourier transform (FFT) stage in said receiver in order to maintain a corresponding set point;

establishing corresponding thresholds for each of said signal energy measurements; and adjusting said IF gain value by an amount based on said signal energy measurements before and after said FFT stage and said corresponding thresholds.

11. The method according to claim 10, wherein said communication receiver is an OFDM communication receiver.

12. The method according to claim 10, wherein said communication receiver is a DMT communication receiver.

13. The method according to claim 10, wherein said signal energy measurements are a sum over n values of the squares of the real and imaginary portions of signal samples, where n corresponds to an inverse of an update rate (UR).

14. The method according to claim 10, further comprising the step of adjusting said IF gain value in stepped increments if a difference between said signal energy measurement performed before said FFT stage and a corresponding pre-FFT threshold are within a predefined tolerance.

15. The method according to claim 10, wherein said thresholds are established to maximize a number of bits representing each sample.

16. The method according to claim 10, wherein said thresholds are established to prevent clipping.

17. The method according to claim 10, wherein said adjusting step further comprises the step of selecting a minimum of a difference between said signal energy measurement before said FFT stage and said corresponding threshold and a difference between said signal energy measurement after said FFT stage and said corresponding threshold.

* * * * *